United States Patent
Hwang et al.

(10) Patent No.: US 7,300,556 B2
(45) Date of Patent: Nov. 27, 2007

(54) METHOD FOR DEPOSITING A THIN FILM ADHESION LAYER

(75) Inventors: Cherngye Hwang, San Jose, CA (US); Eun Row, San Jose, CA (US); Ning Shi, San Jose, CA (US); Eric (Yongjian) Sun, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 420 days.

(21) Appl. No.: 10/651,632

(22) Filed: Aug. 29, 2003

(65) Prior Publication Data

US 2005/0045468 A1 Mar. 3, 2005

(51) Int. Cl.
*C23C 14/34* (2006.01)

(52) U.S. Cl. .............. 204/192.11; 204/192.15; 204/192.38; 427/402

(58) Field of Classification Search .......... 204/192.11, 204/192.15, 192.38; 427/402
See application file for complete search history.

(56) References Cited

U.S. PATENT DOCUMENTS

| | | | |
|---|---|---|---|
| 5,159,508 A | 10/1992 | Grill et al. | ............ 36/235.2 |
| 6,086,730 A | 7/2000 | Liu et al. | ............ 204/192.16 |
| 6,086,796 A * | 7/2000 | Brown et al. | ............ 264/1.33 |
| 6,236,543 B1 | 5/2001 | Han et al. | ............ 360/236.6 |
| 6,429,097 B1 | 8/2002 | Voutsas | |
| 6,503,406 B1 | 1/2003 | Hsiao et al. | ............ 216/22 |
| 6,569,293 B1 | 5/2003 | Makowiecki et al. | .. 204/192.15 |
| 6,795,275 B2 * | 9/2004 | Anan et al. | ............ 360/235.7 |
| 2002/0187405 A1 * | 12/2002 | Carcia | ............ 430/5 |
| 2003/0113588 A1 | 6/2003 | Uwazumi et al. | ...... 422/694.75 |

FOREIGN PATENT DOCUMENTS

JP 2002053954 A 2/2002

* cited by examiner

*Primary Examiner*—Rodney G. McDonald
(74) *Attorney, Agent, or Firm*—G. Marlin Knight

(57) ABSTRACT

A method of physical vapor deposition (PVD) is disclosed in which xenon is used as the operating gas in the vacuum chamber in the deposition of an adhesion layer, preferably silicon, which allows the adhesion layer to be ultra-thin with improved durability over prior art films. The use of argon as is typical in the prior art results in argon atoms being incorporated into the ultra-thin silicon film with deleterious results. In films that are only several angstroms thick, the contamination of the film with argon or other elements can yield a film with reduced adhesion performance and in some cases noble atoms such as argon can escape the film leaving voids or pinholes. The use of the larger and heavier xenon atoms in the vacuum chamber produces a substantially purer film with reduced risk of voids and pinholes. In a preferred embodiment the use of xenon as the operating gas for deposition of the silicon adhesion layer is combined with the use of a filtered cathodic arc (FCA) process to deposit the protective overcoat, preferably carbon based, on a magnetic recording head.

5 Claims, 3 Drawing Sheets

METHOD FOR DEPOSITING A THIN FILM ADHESION LAYER

FIELD OF THE INVENTION

The invention relates to methods for the deposition of thin film adhesion layers, and more particularly to silicon thin film adhesion layers for protective layers and even more particularly to such films as used on thin film magnetic heads.

BACKGROUND OF THE INVENTION

FIG. 1 illustrates one common internal structure of magnetic transducer 20 (also called a head) which can be used in a magnetic disk drive. The features are not drawn to scale, since the wide range of thicknesses would make the smaller features indistinct. Except as noted below all of the features discussed herein are sized according to the prior art. The thin film protective layer 45 and the adhesion layer 43 protect the vulnerable elements such as the magnetoresistive sensor 35, shields S1 and S2, and pole pieces P1, P2 and P3 which are commonly made of NiFe. The surface of the protective layer 45 is at the air-bearing surface (ABS) for the transducer which confronts the surface of the rotating disk (not shown). The combined thickness of the adhesion and protective layers limits how close the magnetoresistive sensor 35 and other elements of the transducer are to the magnetic media of the disk and, therefore, limits the areal density of information that can be written on and read from the disk.

In U.S. Pat. No. 6,503,406 to Hsiao, et al. the use of a silicon adhesion layer with a carbon protective layer for a magnetic transducer is described. Grill, et al., in U.S. Pat. No. 5,159,508 disclose a dry process for forming a protective coating over the slider prior to the lithographic process. The protective coating comprises two layers, the first layer an adhesion layer, e.g. silicon, and a second layer of amorphous carbon. The ABS is then formed on the slider covered with the protective coating.

U.S. Pat. No. 6,086,730 to Liu, et al., describes a method for sputtering a carbon protective layer with a high $sp^3$ bond content which involves applying relatively high voltage pulses to the carbon target. Liu '730 asserts that the resulting carbon overcoat has good durability and corrosion resistance down to low thicknesses. In addition to the pulsed DC sputtering with above mentioned characteristics, Liu also notes that the substrate can have a negative voltage bias in order to enhance the ta-C:H characteristics of the carbon film. Nominally the substrate is biased negative to the ground, so that there is potential of additional bombardment of the substrate by the argon ion used to sputter the target or to accelerate the carbon ions that may have formed during sputtering at high target bias potential. When substrate bias is applied, the positive ions of carbon and argon will be accelerated toward the substrate during deposition. Liu does not note, however, that argon atoms can be incorporated in the carbon film with undesirable results.

In the typical sputtering process, the atmosphere of the reaction chamber contains a noble gas which is most commonly argon, but helium, neon, krypton, and xenon are commonly mentioned as alternatives. (See for example, U.S. Pat. No. 6,569,293 to Makowiecki, et al.)

In U.S. published application No. 20030113588, Jun. 19, 2003, Uwazumi, Hiroyuki, et al. indicate that the concentration of the atoms of one of the inert gases remaining in the underlayer on a magnetic thin film disk is reduced by mixing the one inert gas with a different inert gas having larger atomic weight and radius. The magnetic layer is laminated onto the underlayer. The underlayer is deposited in a gas atmosphere containing argon and at least one of krypton and xenon in an amount sufficient to reduce the argon remaining in the underlayer to less than 1,000 ppm. Such a gas atmosphere contains at least 10% of krypton or xenon, and pressurized to a range of 30-70 mTorr. The underlayer is formed with a film structure composed of fine grains, which are suitable for epitaxial growth of the magnetic layer.

In U.S. Pat. No. 6,236,543 Han, et al., describe the use filtered cathodic arc (FCA) deposition to form landing pads for a slider air-bearing surface (ABS) of tetrahedral amorphous carbon (t-aC). The t-aC is extremely hard and highly stressed. The pads are fabricated after the slider has been coated with an adhesion layer such as Si, SiC, $SiO_2$ or $Si_3N_4$, and a carbon overcoat of diamond-like-carbon (DLC) or t-aC has been formed. The pads are formed by filtered cathodic arc deposition, which uses carbon ions from a graphite cathode and a filter that removes macroparticles. The resulting t-aC material is said to have properties virtually equal to those of diamond, including high stress and hardness associated with nearly ubiquitous $sp^3$ bonds. Other benefits of t-aC are a reduction in surface energy and wettability.

In order to improve the performance of magnetic thin film transducers the protective overcoat 45 and the adhesion layer 43 must be made as thin as possible to reduce the separation from the magnetic media and still maintain the protective function.

SUMMARY OF THE INVENTION

The applicants disclose a method of physical vapor deposition (PVD) in which xenon is used as the operating gas in the vacuum chamber in the deposition of an adhesion layer, preferably silicon, which allows the adhesion layer to be ultra-thin with improved durability over prior art films. The use of argon as is typical in the prior art results in argon atoms being incorporated into the ultra-thin silicon film with deleterious results. In films that are only several angstroms thick, the contamination of the film with argon or other elements can yield a film with reduced adhesion performance and in some cases noble atoms such as argon can escape the film leaving voids or pinholes. The use of the larger and heavier xenon atoms in the vacuum chamber produces a substantially purer film with reduced risk of voids and pinholes. In a preferred embodiment the use of xenon as the operating gas for deposition of the silicon adhesion layer is combined with the use of a filtered cathodic arc (FCA) process to deposit the protective overcoat, preferably carbon based, on a magnetic recording head.

DETAILED DESCRIPTION OF THE INVENTION

The invention teaches that using xenon instead of argon for the vacuum deposition of silicon or similar material in ultra-thin films yields surprisingly superior results. The prior art has taught that the noble gases argon, krypton and xenon are essentially interchangeable for use in a PVD process. The applicants have found that intrinsic properties of the films can be improved by reducing the incorporation of atoms of the operating gas into the film. The larger and heavier xenon atoms are incorporated into an ultra-thin silicon film at a rate that can be an order of magnitude lower than the rate of argon incorporation. The superior silicon film is particularly important when it will be subjected to a process used to form diamond-like carbon (DLC) such as the filtered cathodic arc (FCA) which uses high energy ions to form the bonds of DLC. The combination of the silicon adhesion layer deposited using xenon and an FCA deposited DLC is particularly useful for a magnetic recording head which requires a hard, dense, impervious protective layer structure that can be less than 25 angstroms thick. In general, the silicon layer for a magnetic head should be less than 20 angstroms. Although in the embodiments described below an ion beam generator and a plasma beam neutralizer are used in the PVD process, the results should apply to magnetron sputtering and any other process which have previously used argon as the operating gas.

In an experiment performed by the applicants, a silicon film was deposited using argon as the operating gas in a PVD process in accordance with the prior art. Xray relectometry (XRR) density measurements of the resulting film were higher than the theoretical values for a silicon film indicating that heavier argon atoms had contaminated the film. A second silicon film was PVD deposited using xenon as the operating gas. This film's XRR density measurement was near the theoretical value for silicon confirming that the film was substantially free of xenon or other contaminating atoms. The data also show that the film was substantially free from pinholes or voids, since these would result in a lower than expected density value.

Figure 1:
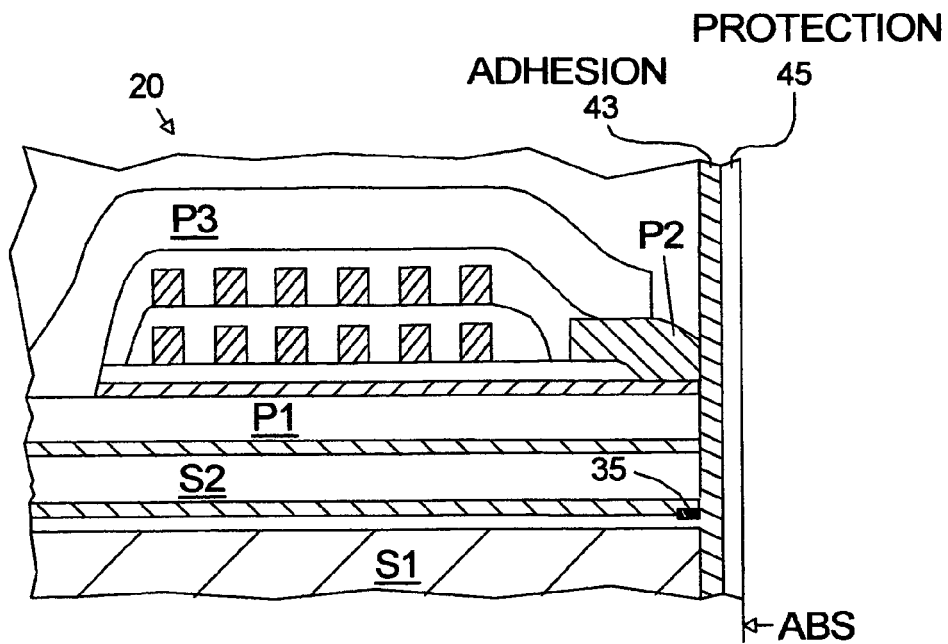
FIG. 1 is an illustration of a layer structure for a magnetic thin film head on which the invention can advantageously be used.
Figure 2:
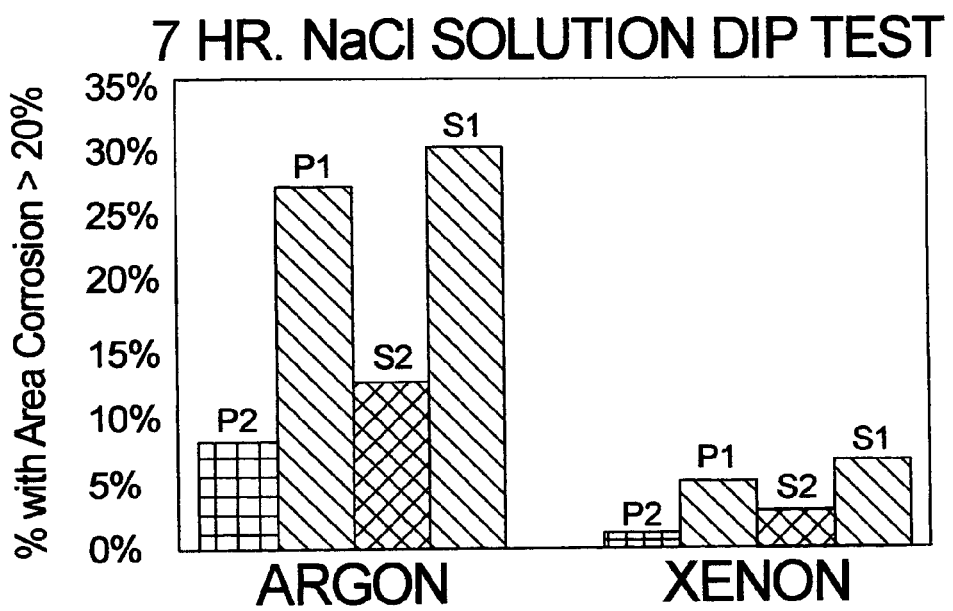
FIG. 2 is a bar chart of visual corrosion after a 7 hour NaCl solution dip test for corrosion comparing magnetic recording heads made using xenon according to the invention with those made using argon according to the prior art.

In another experiment two sets of magnetic heads were prepared using a PVD process to deposit a silicon adhesion layer approximately 6 angstroms thick. Silicon target(s) were used with an ion beam generator for the primary ion source, an operating gas and a plasma beam neutralizer (PBN) gas. For one set of heads the silicon adhesion layer was deposited using xenon as the operating gas and argon was used for the PBN gas. The second set of heads was processed according to the prior art using argon for both gases. On each set of heads a diamond-like carbon (DLC) protective layer of approximately 9 angstroms was deposited on the silicon using an FCA process. Tests of the corrosion resistance were performed on both types of heads. A 7 hour NaCl solution dip test was followed with optical examination of S1, S2, P1 and P2. For graphing, the binary cutoff criterion for each structures was selected as 20% corrosion of the ABS surface area. The percentages of heads with P2, P1, S2 and S2 showing an area greater than 20% corrosion for each of the two groups of heads are shown in FIG. 2. For each of the pole pieces and shields, the heads fabricated using xenon showed significantly less corrosion. For example, S1 had the highest rate of corrosion in each set of heads, but approximately 30% of the heads from the argon process had S1's with greater than 20% visible corrosion. Heads prepared using xenon had similarly corroded S1's in only about 6% of the cases. The results for the other structures were consistent with the result for S1.

Figure 3:
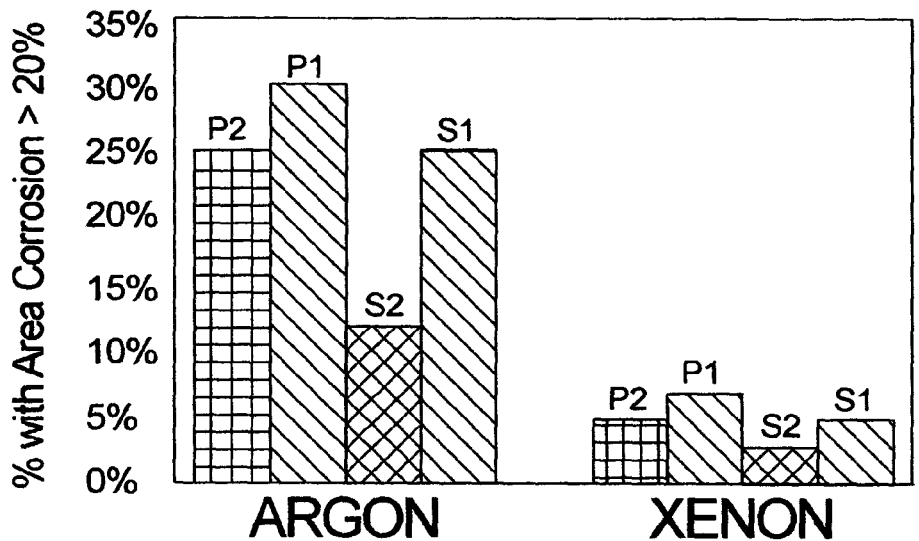
FIG. 3 is a bar chart of visual corrosion after a 7 hour NaCl solution dip test plus a 2 hour ultrasonic (US) NaCl solution dip test for corrosion comparing magnetic recording heads made using xenon according to the invention with those made using argon according to the prior art.

Another test of corrosion properties that was performed was a 7 hour NaCl solution dip followed by 3 hours of a US NaCl solution dip test. The same optical examination of Si, S2, P1 and P2 described above was performed. The percentages of heads with P2, P1, S2 and S2 showing an area greater than 20% corrosion for each of the two groups of heads are shown in FIG. 3. For each of the pole pieces and shields, the heads fabricated using xenon again showed significantly less corrosion.

Figure 4:
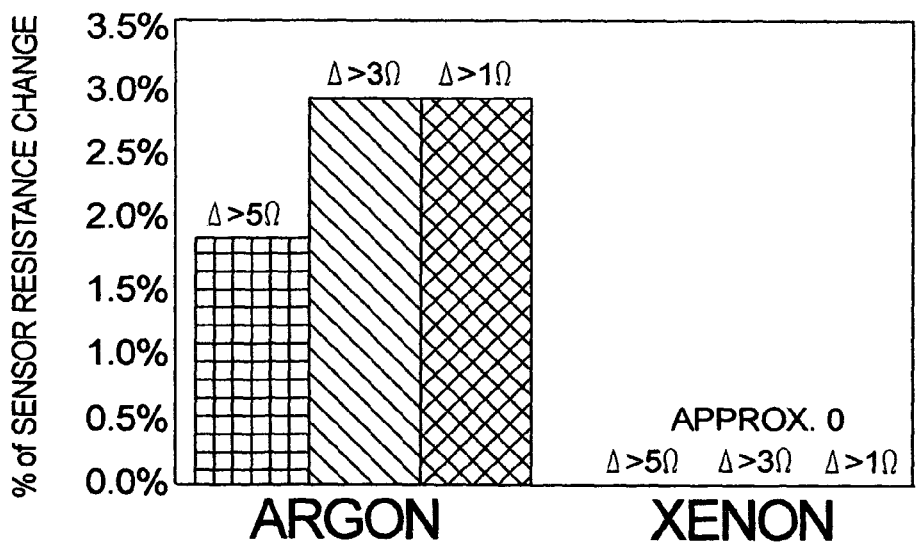
FIG. 4 is a bar chart of the electrical resistance change in the sensor after a 7 hour NaCl solution dip test for corrosion comparing magnetic recording heads made using xenon according to the invention with those made using argon according to the prior art.

Another method of evaluating corrosion was used for the MR sensor. FIG. 4 is a bar chart of the electrical resistance change in the MR sensor after the 7 hour NaCl solution dip test. The three bars for each set of heads represent the number of heads having resistance chance greater than 5 ohms, 3 ohms and 1 ohm respectively. The magnetic recording heads made using xenon according to the invention showed only negligible change in sensor resistance, so the bars for each range are approximately zero. The heads prepared using argon included 3% with a change greater than 3 ohms and almost 2% with a change greater than 5 ohms. The heads prepared according to the invention showed a substantial improvement in corrosion resistance for the MR sensor.

Figure 5:
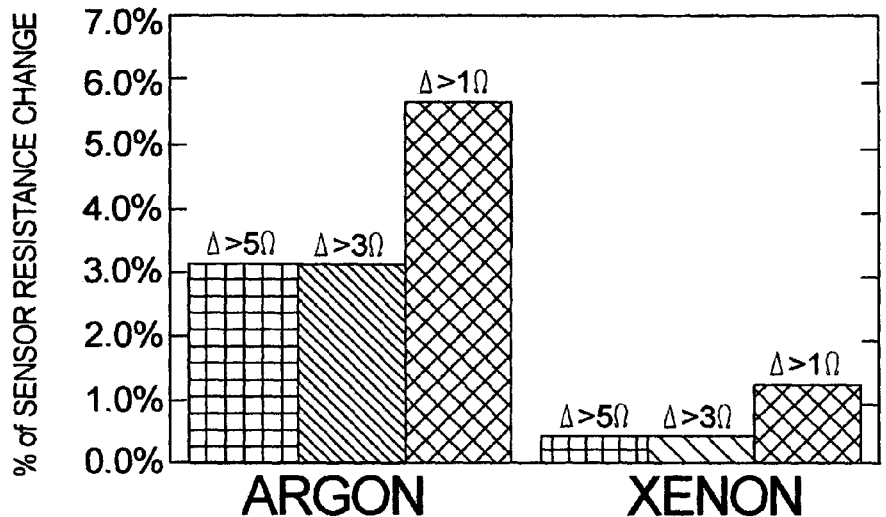
FIG. 5 is a bar chart of the electrical resistance change in the sensor after a 7 hour NaCl solution dip plus a 2 hour ultrasonic (US) NaCl dip test for corrosion comparing magnetic recording heads made using xenon according to the invention with those made using argon according to the prior art.

FIG. 5 is a bar chart of the electrical resistance change in the MR sensor after the 7 hour NaCl solution dip plus a 2 hour US NaCl dip test for corrosion comparing magnetic recording heads made using xenon according to the invention with those made using argon according to the prior art. For each of the three ranges the heads with the xenon deposited silicon adhesion layer showed a significant improvement in corrosion resistance. For example, the heads with argon deposited adhesion layer had a 5 ohm change in more than 3% of the cases, while the xenon-heads included only approximately 0.4% with more than a 5 ohm change.

Figure 6:
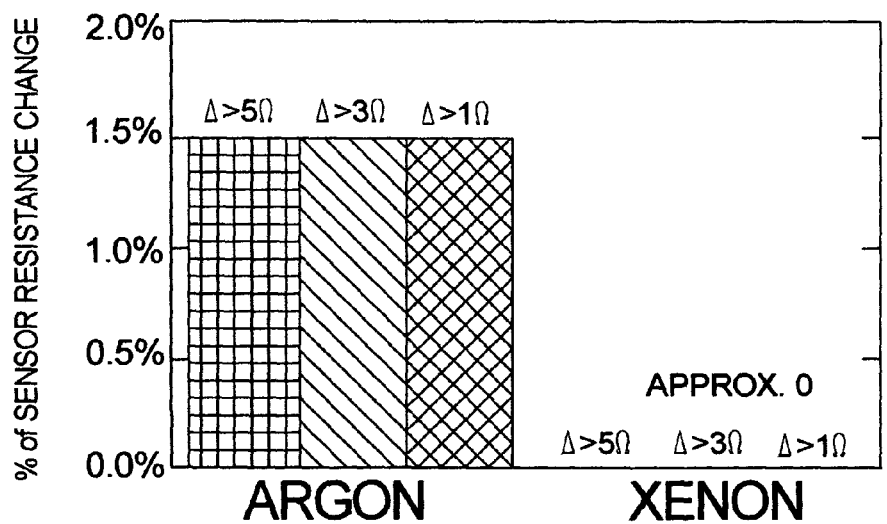
FIG. 6 is a bar chart of the electrical resistance change in the sensor after a 3 minute [NaCl+$H_2SO_4$] solution dip test for corrosion comparing magnetic recording heads made using xenon according to the invention with those made using argon according to the prior art.

FIG. 6 is a bar chart of the electrical resistance change in the MR sensor after a 3 minute [NaCl+$H_2SO_4$] solution dip test for corrosion comparing the magnetic recording heads made using xenon according to the invention with those made using argon according to the prior art. The xenon-heads again showed only negligible change in sensor resistance while the other heads included 1.5% with a change greater than 5 ohms.

The results above were achieved even though argon was being used as the PBN gas. The PBN gas typically is less than 5% of the total gas in the vacuum chamber. The PVD process described above can be further improved by using xenon as the PBN gas.

The invention has been described with respect to use on thin film magnetic heads, but other uses and applications which can benefit from the properties of the adhesion and protective layer properties of the invention will be apparent to those skilled in the art.

The invention claimed is:

1. A method of fabricating a thin film magnetic head comprising the steps of:
   depositing a thin film of silicon on the thin film magnetic head using xenon as an operating gas in a PVD process with an ion beam generator and a plasma beam neutralizer using xenon as an operating gas; and
   depositing a diamond-like carbon layer on the thin film of silicon.

2. The method of claim 1 wherein the step of depositing a diamond-like carbon layer further comprises using a filtered cathodic arc process.

3. The method of claim 1 wherein the thin film of silicon is less than 10 angstroms thick.

4. A method of fabricating a thin film magnetic head comprising the steps of:
   depositing a thin film of silicon on the thin film magnetic head using xenon as an operating gas in a PVD process with an ion beam generator and a plasma beam neutralizer using xenon as an operating gas; and
   depositing a diamond-like carbon layer on the thin film of silicon using a filtered cathodic arc process.

5. The method of claim 4 wherein the thin film of silicon is less than 20 angstroms thick.

* * * * *